(12) United States Patent
Chevallaz et al.

(10) Patent No.: US 10,250,861 B2
(45) Date of Patent: Apr. 2, 2019

(54) METHODS AND DEVICES FOR DETECTING OPEN AND/OR SHORTS CIRCUITS IN MEMS MICRO-MIRROR DEVICES

(71) Applicant: North Inc., Kitchener (CA)

(72) Inventors: Eric Chevallaz, Pompales (CH); Nicolas Abele, Demoret (CH)

(73) Assignee: North Inc., Kitchener, Ontario (CA)

( * ) Notice: Subject to any disclaimer, the term of this patent is extended or adjusted under 35 U.S.C. 154(b) by 327 days.

(21) Appl. No.: 15/026,553

(22) PCT Filed: Nov. 22, 2013

(86) PCT No.: PCT/EP2013/074432
§ 371 (c)(1),
(2) Date: Mar. 31, 2016

(87) PCT Pub. No.: WO2015/078482
PCT Pub. Date: Jun. 4, 2015

(65) Prior Publication Data
US 2016/0255318 A1    Sep. 1, 2016

(51) Int. Cl.
| | |
|---|---|
| *G02B 26/08* | (2006.01) |
| *H04N 9/31* | (2006.01) |
| *G09G 3/34* | (2006.01) |
| *G01R 31/02* | (2006.01) |
| *H03K 5/24* | (2006.01) |
| *H03K 19/21* | (2006.01) |

(52) U.S. Cl.
CPC ......... *H04N 9/3194* (2013.01); *G01R 31/025* (2013.01); *G01R 31/026* (2013.01); *G02B 26/085* (2013.01); *G02B 26/0833* (2013.01); *G09G 3/346* (2013.01); *H03K 5/24* (2013.01); *H03K 19/215* (2013.01); *H04N 9/3135* (2013.01); *H04N 9/3155* (2013.01); *G09G 2330/04* (2013.01); *G09G 2330/12* (2013.01)

(58) Field of Classification Search
CPC .. H04N 9/3194; H04N 9/3135; H04N 9/3155; G01R 31/025; G01R 31/026; G02B 26/0833; G02B 26/085; G02B 26/0816; G02B 26/08; G09G 3/346; G09G 2330/04; G09G 2330/12; H03K 5/24; H03K 19/215
USPC ...................................................... 359/224.1
See application file for complete search history.

(56) References Cited

U.S. PATENT DOCUMENTS

| | | | | |
|---|---|---|---|---|
| 6,958,921 | B1 * | 10/2005 | Wang .................... | H02M 3/337 363/25 |
| 6,995,989 | B1 * | 2/2006 | Wang ..................... | H02M 1/08 363/21.08 |
| 2002/0196026 | A1 * | 12/2002 | Kimura ................ | G01R 31/361 324/426 |

(Continued)

FOREIGN PATENT DOCUMENTS

JP    2001-91890 A    5/2011

OTHER PUBLICATIONS

International Search Report dated Nov. 11, 2014 in International Patent Application No. PCT/EP2013/074432.

*Primary Examiner* — William R Alexander
(74) *Attorney, Agent, or Firm* — Cozen O'Connor

(57) ABSTRACT

According to the present invention there is provided methods and devices for detecting open and/or short circuits in MEMS micro-mirror devices, which use relative comparisons of voltage levels within the MEMS micro-mirror devices for detecting the occurrence of open and/or short circuits.

20 Claims, 12 Drawing Sheets

(56) References Cited

U.S. PATENT DOCUMENTS

| | | | |
|---|---|---|---|
| 2007/0007912 A1 | 1/2007 | Yang et al. | |
| 2008/0158760 A1 | 7/2008 | Moyer et al. | |
| 2009/0262314 A1* | 10/2009 | Nishigaki | G03B 21/00 353/98 |
| 2009/0284190 A1* | 11/2009 | Matsubara | G02B 26/085 318/114 |
| 2015/0316762 A1* | 11/2015 | Hambeck | G02B 26/0833 359/199.1 |
| 2015/0338645 A1* | 11/2015 | Gamet | G02B 26/085 359/199.4 |

* cited by examiner

METHODS AND DEVICES FOR DETECTING OPEN AND/OR SHORTS CIRCUITS IN MEMS MICRO-MIRROR DEVICES

FIELD OF THE INVENTION

The present invention concerns methods and devices for detecting open and/or short circuits in MEMS micro-mirror devices, which use relative comparisons of voltage levels within the MEMS micro-mirror devices for detecting open and/or short circuits.

DESCRIPTION OF RELATED ART

A MEMS micro-mirror device is a device that contains an optical MEMS (Micro-Electrical-Mechanical-System). The optical MEMS micro-mirror device may comprise an elliptical, cylindrical, rectangular, square or random shape micro-mirror that is adapted to move and to deflect light over time. The micro-mirror is typically connected by torsional arms to a fixed part and can tilt and oscillate along one or two axis. For example it can oscillate vertically and horizontally. Different actuation principles can be used, including electrostatic, thermal, electro-magnetic or piezo-electric. MEMS micro-mirror devices are known in which the area of these micro-mirrors are around a few $mm^2$. In this case, the dimensions of the MEMS micro-mirror device, comprising the packaging, is around ten $mm^2$. This MEMS micro-mirror device is usually made of silicon, and can comprise a package that can include the driving actuation electronics. Various optical components, such as for example lenses, beam combiner, quarter-wave plates, beam splitter and laser chips, are assembled with the packaged MEMS to build a complete system.

A typical application of the MEMS micro-mirror devices is for optical scanning and projection systems. In a projection system, a 2-D or 3-D image or video can be displayed on any type of projection surface. In a colour system, each pixel of the image is generated by combining modulated red, green and blue laser light, by means of, for example, a beam combiner, to generate a combined light beam which defines a pixel of the image or video. The MEMS micro-mirror in the MEMS micro-mirror device directs the combined light beam to a projection surface where the pixel of the image or video is displayed. Successive pixels of the image or video are display in this manner. By means of its oscillations, the MEMS micro-mirror within the MEMS micro-mirror device will continuously scan the combined light beam from left to right and from top to bottom (or according to a different trajectory including e.g. Lissajou trajectories) so that all the pixels of the image, or video, are displayed on the projection surface, successively, pixel-by-pixel. The MEMS micro-mirror will oscillate about its oscillation axes at a frequency which ensures that the combined light beam is scanned across the projection surface at such a speed that a complete image is visible to a person viewing. A projection device which uses a MEMS micro-mirror to scan light across a projection surface is commonly referred to as a MEMS micro-mirror projection device.

Typically, the MEMS micro-mirror in a MEMS micro-mirror projection device is able to oscillate along a single oscillation axis. Therefore, in order to display a 2-D image on a screen a projection system will require two MEMS micro-mirrors; a first MEMS micro-mirror which is required to scan the combined light beam along the horizontal and a second MEMS micro-mirror which is required to scan the combined light beam along the along the vertical. Alternatively the MEMS micro-mirror in a MEMS micro-mirror projection device could be configured such that it can be oscillated about two orthogonal oscillation axes.

Referring now to FIGS. 1a and 1b which show a MEMS micro-mirror component 1 of a MEMS micro-mirror projection device. FIG. 1a provides a plan view of the MEMS micro-mirror component 1 and FIG. 1b shows a cross sectional view of the MEMS micro-mirror component1, taken along A-A' of FIG. 1a.

The MEMS micro-mirror component 1 of the MEMS micro-mirror projection device comprises a first support frame 2. A first torsional arm 3a and second torsional arm 3b connect a MEMS micro-mirror 4 to the support frame 2. In this embodiment the support frame 2 is fixed (i.e. immovable). The first and second torsional arms 3a,b define a first oscillation axis 7 for the MEMS micro-mirror 4. A first conduction coil 5 is supported on, and connected to, the MEMS micro-mirror 4. The first conduction coil 5 is arranged to extend, from a first electrical contact 9a which is located on the support frame 2, along the first torsional arm 3a, around the perimeter of the MEMS micro-mirror 4 and back along the first torsional arm 3a to a second electrical contact 9b which is located on the support frame 2. In the MEMS micro-mirror component 1 the conduction coil 5 is shown to be arranged to have one turn on MEMS micro-mirror 4; it will be understood that the conduction coil 5 may extend around the MEMS micro-mirror 4 any number of times so as to define any number of turns on the MEMS micro-mirror 4.

Collectively, the first support frame 2, first and second torsional arms 3a,b and the MEMS micro-mirror 4, and first conduction coil 5, define collectively what is referred to as a MEMS die 10. As shown in FIG. 1b the MEMS die 10 is arranged in cooperation with a magnet 6 such the first conduction coil 5 is submerged in the magnetic field 'B' generated by the magnet 6.

During use an electric current 'I' is passed through the first conduction coil 5. As the first conduction coil 5 is submerged in the magnetic field 'B' created by the magnet 6, the conduction coil 5 will provide a Laplace force which will be applied to the MEMS micro-mirror 4. The Laplace force will cause the MEMS micro mirror 4 to move about its first oscillation axis 7. The electric current 'I' which is passed through the first conduction coil 5 is configured for example to be sinuous or square, so that the MEMS micro-mirror 4 is continuously oscillated about its first oscillation axis 7. If the MEMS micro-mirror 4 reflects light as it is oscillating about the first oscillation axes 7, light reflected by the MEMS micro-mirror 4 will be scanned along the horizontal or vertical. This will, for example, enable combined light beams which the MEMS micro mirror 4 receives, to be scanned across the projection screen.

It should be understood that the MEMS micro-mirror component 1 could alternatively comprise a MEMS micro-mirror which can oscillate about two orthogonal oscillation axes; in such a case the MEMS micro mirror component 1 will typically comprise a second conduction coil. Such a MEMS micro-mirror component 1 could scan light in two dimensions (e.g. along the horizontal and vertical) when the conduction coils conduct current.

If a short circuit or open circuit occurs in the conduction coil 5 which drives the MEMS micro-mirror 4 to oscillate about the oscillation axes 7, then the MEMS micro-mirror 4 will stop oscillating; as a result light reflected by the MEMS micro-mirror 4 would no longer be scanned but would be concentrated along a single direction to a single point on the display screen. The high concentration of light which is reflected in the single direction can damage eyes of person. Accordingly, is it necessary to quickly detect the occurrence of open or short circuits in MEMS mirror projection devices so that the MEMS mirror projection devices can be quickly shut-down in the event of an open or short circuit, so as to avoid damaging a person's eyes.

Typically the detection of open or short circuits in MEMS micro-mirror projection devices is achieved by measuring the voltage which is across the MEMS micro-mirror 4 and comparing the measured voltage to a reference voltage. The voltage across the MEMS micro-mirror 4 will increase in the case of an open or short circuit; thus if the measuring the voltage across the MEMS micro-mirror 4 exceeds the reference voltage then a short or open circuit is detected. When a short or open circuit is detected the MEMS micro-mirror projection device is usually automatically shut-down so as to avoid damaging the eyes of a person. However, the voltage across the MEMS micro-mirror 4 and the reference voltage are each affected by temperature; the temperature of MEMS micro-mirror projection device will increase during use and this increase in temperature affects the voltage across the MEMS micro-mirror 4 and the reference voltage. Accordingly, the measured voltage across the MEMS micro-mirror 4 may exceed the reference voltage due to changes in temperature alone and not due to the occurrence of an open or short circuit. Thus, current methods is can erroneously indicate the occurrence of an open or short circuit in the MEMS micro-mirror projection device, which leads to unnecessary shut-down of the device.

Another approach to the detection of open or short circuits in MEMS micro-mirror projection devices involves the use of PLL (i.e. a phase locked loop, which is a circuit that provides constant phase shift between two signals). However the problem with this approach is that it is slow to detect an open or short circuit. Therefore, there is a long period between the actual occurrence of the open or short circuit in MEMS micro-mirror projection device and the shutting-down of the MEMS mirror projection device. There is a high risk that the eyes of a person become damaged during in the period between the actual occurrence of the open or short circuit and the shutting-down of the MEMS micro-mirror projection device.

It is an aim of the present invention to obviate or mitigate at least some of the above-mentioned disadvantages.

BRIEF SUMMARY OF THE INVENTION

According to the invention, these aims are achieved by means of a MEMS mirror device comprising, a H bridge circuit; a MEMS mirror which is connected as a load to the H bridge circuit so that voltage can be selectively applied across the MEMS mirror in either direction; and a current source which is connected to the H bridge circuit; wherein the MEMS mirror device further comprises, a means for comparing the voltages at a first and second side of the MEMS mirror to a voltage across the current source, so that an open circuit in the MEMS mirror device can be detected.

The H bridge circuit and/or the comparator and/or any other circuit blocks or features, and the MEMS mirror may be provided on separate, mechanically independent, silicon wafers or may be provided on the same silicon wafer.

Advantageously the present invention compares relative levels in the device in order to detect the occurrence of a short or open circuit. The detection of a short or open circuits therefore independent of temperature changes in the device, changes in bias currents, changes in resistances. Accordingly the occurrence of a short or open circuit can be detected more accurately.

The first and second sides of the MEMS mirror are preferably opposite sides of the MEMS mirror where an actuation coil on the MEMS mirror is electrically connected to the H bridge circuit. A actuation coil is a coil which can conduct current to effect oscillation of the MEMS mirror about one or more oscillation axes.

The means for comparing may comprise an IC circuit

The means for comparing may comprise an Analogue-to-Digital converter.

The current source may comprise a first and second transistor connected in series.

The means for comparing may comprise,
a first comparator;
a second comparator; and
an OR gate;
wherein outputs of the first and second comparator are arranged to be input to the OR gate, and
wherein the voltage at the first side of the MEMS mirror and the voltage across the current source are inputs to the first comparator and the voltage at the second side of the MEMS mirror and the voltage across the current source are inputs to the second comparator.

The current source may comprise a first and second transistor connected in series and the means for comparing is configured to compare voltages at the first and second sides of the MEMS mirror to a voltage at a junction between the first and second transistors.

The means for comparing may comprise,
a first comparator;
a second comparator; and
an OR gate;
wherein outputs of the first and second comparator are arranged to be input to the OR gate, and
wherein the voltage at the first side of the MEMS mirror and the voltage at the junction between the first and second transistors are inputs to the first comparator and the voltage at the second side of the MEMS mirror and the voltage at the junction between the first and second transistors are inputs to the second comparator.

According to a further aspect of the present invention there is provided a MEMS mirror device comprising,
a H bridge circuit;
a MEMS mirror which is connected as a load to the H bridge circuit so that voltage can be selectively applied across the MEMS mirror in either direction; and
a current source which is connected to the H bridge circuit wherein current source comprises a first and second transistor connected in series; wherein the MEMS mirror device further comprises,
a means for comparing which is configured to compare voltage across the first and second transistors to voltage at a junction between the first and second transistors to detect an open circuit.

The means for comparing may comprise a single comparator wherein the voltage across the first and second transistors and the voltage at a junction between the first and second transistors are inputs to the single comparator.

According to a further aspect of the present invention there is provided a method for detecting an open circuit in the MEMS mirror device comprising, a H bridge circuit; a MEMS mirror which is connected as a load to the H bridge circuit so that voltage can be selectively applied across the MEMS mirror in either direction; and a current source which is connected to the H bridge circuit; wherein the MEMS mirror device further comprises, a means for comparing the voltages at a first and second side of the MEMS mirror to a voltage across the current source, so that an open circuit in the MEMS mirror device can be detected, the method comprising the step of, comparing voltages at first and second sides of the MEMS mirror to a voltage across the current source, detecting a change in result of the comparison to indentify the occurrence of an open circuit in the MEMS mirror device.

The step of comparing voltages at first and second sides of the MEMS mirror to a voltage across the current source may comprise, comparing the voltage at the first side of the MEMS mirror to the voltage across the current source using a first comparator, and, comparing the voltage at the second side of the MEMS mirror to the voltage across the current source using a second comparator, and, passing the output of the first and second comparators through a OR gate; and wherein the step of detecting a change in the result of the comparison to indentify the occurrence of an open circuit in the MEMS mirror device comprises, detecting a change in the output of the OR gate.

In any of the above-mentioned methods, the current source in said MEMS mirror device comprises a first and second transistor connected in series, and the step of comparing voltages at first and second sides of the MEMS mirror to a voltage across the current source may comprise, comparing the voltage at the first side of the MEMS mirror to a voltage at a junction between the first and second transistors using a first comparator, and, comparing the voltage at the second side of the MEMS mirror to the voltage at a junction between the first and second transistors using a second comparator, and, passing the output of the first and second comparators through a NOR gate; and, wherein the step of detecting a change in the result of the comparison to indentify the occurrence of an open circuit in the MEMS mirror device comprises, detecting a change in the output of the NOR gate.

The method may comprise the steps of comparing voltage across the first and second transistors to voltage at a junction between the first and second transistors to detect an open circuit using a comparator; and wherein the step of detecting a change in result of the comparison to indentify the occurrence of an open circuit in the MEMS mirror device comprises, detecting a change in the output of the comparator.

According to a further aspect of the present invention there is provided a MEMS mirror device comprising, a H bridge circuit;

a MEMS mirror which is connected as a load to the H bridge circuit so that voltage can be selectively applied across the MEMS mirror in either direction; and a current source which is connected to the H bridge circuit; wherein the MEMS mirror device further comprises a means for comparing the voltages at a first and second side of the MEMS mirror, so that a short circuit in the MEMS mirror device can be detected.

The first and second sides of the MEMS mirror are preferably opposite sides of the MEMS mirror where an actuation coil on the MEMS mirror is electrically connected to the H bridge circuit. An actuation coil is a coil which can conduct current to effect oscillation of the MEMS mirror about one or more oscillation axes.

The means for comparing may comprise an IC circuit

The means for comparing may comprise an Analogue-to-Digital converter.

The means for comparing may comprise, a first comparator;

a second comparator; and an XNOR gate;

wherein outputs of the first and second comparator are arranged to be input to the XNOR gate, and wherein the voltage at the first side of the MEMS mirror and the at the voltage at the second side of the MEMS mirror are inputs to the first comparator and the voltage at the first side of the MEMS mirror and the at the voltage at the second side of the MEMS mirror are inputs to the second comparator.

The means for comparing may comprise, a single XNOR gate wherein a ground pin of the XNOR gate is electrically connected so as to have the same potential as the voltage across the current source, and wherein the voltage at the first side of the MEMS mirror is a first input to the XNOR gate and the voltage at the second side of the MEMS mirror is a second input to the XNOR gate.

Preferably the ground pin of the XNOR gate is electrically connected to a junction which is between the H-bridge and the current source.

According to a further aspect of the present invention there is provided a method for detecting a short circuit in the MEMS mirror device which comprise, a H bridge circuit; a MEMS mirror which is connected as a load to the H bridge circuit so that voltage can be selectively applied across the MEMS mirror in either direction; and a current source which is connected to the H bridge circuit; wherein the MEMS mirror device further comprises a means for comparing the voltages at a first and second side of the MEMS mirror, so that a short circuit in the MEMS mirror device can be detected, the method comprising the step of, comparing the voltages at the first and second side of the MEMS mirror, so that a short circuit in the MEMS mirror device can be detected, detecting a change in result of the comparison to indentify the occurrence of a short circuit in the MEMS mirror device.

The step of comparing the voltages at the first and second side of the MEMS mirror, so that a short circuit in the MEMS mirror device can be detected, may comprise, comparing the voltage at the first side of the MEMS mirror to the voltage at the second side of the MEMS mirror, using a first comparator, and, comparing the voltage at the first side of the MEMS mirror to the voltage at the second side of the MEMS mirror, using a second comparator, and, passing the output of the first and second comparators through an XNOR gate; and wherein the step of detecting a change in the result of the comparison to indentify the occurrence of a short circuit in the MEMS mirror device comprises, detecting a change in the output of the XNOR gate.

The step of comparing the voltages at the first and second side of the MEMS mirror, so that a short circuit in the MEMS mirror device can be detected, may comprise, providing the voltage at the first side of the MEMS mirror as a first input to a single XNOR gate which has its ground electrically connected so as to have the same potential as the voltage across the current source;

providing the voltage at the second side of the MEMS mirror as a second input to the single XNOR gate; and wherein the step of detecting a change in the result of the comparison to indentify the occurrence of a short circuit in the MEMS mirror device comprises, detecting a change in the output of the XNOR gate.

According to a further aspect of the present invention there is provided a MEMS mirror device comprising, a H bridge circuit;

a MEMS mirror which is connected as a load to the H bridge circuit so that voltage can be selectively applied across the MEMS mirror in either direction; and a current source which is connected to the H bridge circuit; wherein the MEMS mirror device further comprises a means for comparing voltage across the current source to an reference voltage to detect a short circuit in the MEMS mirror device.

The reference voltage may be an average value for the voltage across a current source over a predefined period of time.

The means for comparing may comprise, a comparator; and a low pass filter which is electrically connected to a junction between the H bridge and current source;

wherein a first input of the low pass filter is electrically connected to a junction between the H bridge and current source so that the first input to the comparator is at a voltage which is equal to the voltage across the current source, and wherein a second input to the comparator is electrically connected to low pass filter so that the second input to the comparator is at a voltage which is equal to the voltage across the low pass filter.

The low pass filter can store previous voltages across the current source. The voltage across the low pass filter is therefore the average value for the voltage across a current source over a predefined period of time. The low pas filter may comprise one or more capacitors.

The means for comparing further may comprise a buffer which is electrically connected between said junction and capacitor.

The means for comparing further may comprise a means for providing an offset to the average value for the voltage across a current source.

A method for detecting a short circuit in the MEMS mirror device which comprises a H bridge circuit; a MEMS mirror which is connected as a load to the H bridge circuit so that voltage can be selectively applied across the MEMS mirror in either direction; and a current source which is connected to the H bridge circuit; wherein the MEMS mirror device further comprises a means for comparing voltage across the current source to an reference voltage to detect a short circuit in the MEMS mirror device, the method comprising the step of, comparing voltage across the current source to an reference voltage;

detecting a change in result of the comparison to indentify the occurrence of a short circuit in the MEMS mirror device.

The reference voltage may be an average value for the voltage across a current source over a predefined period of time.

The method may comprise the step of storing voltage across the current source using a low pass filter. Storing voltage across the current source in the low pass filter ensures that the voltage across the low pass filter is representative of the average value for the voltage across a current source over a predefined period of time.

The method may comprise the step of comparing the voltage across the low pass filter to a comparator which is used to compare the voltage across the current source to an average value for the voltage across a current source, using a buffer.

The method may comprise the step of applying an offset to the average value for the voltage across a current source. Preferably the offset is applied before the voltage across the current source to an average value for the voltage across a current source.

Preferably the offset is applied by the comparator. Preferably the comparator comprises an intrinsic offset at its input.

The means for comparing voltage across the current source to an reference voltage to detect a short circuit in the MEMS mirror device may comprise, an analogue to digital converter which is electrically connected to a junction between the H bridge and current source so that the analogue to digital converter can convert the voltage across the current source to a digital value; and a comparator which is arranged to compare the digital value for the voltage across the current source to a reference digital value which is representative of said reference voltage.

The step of comparing voltage across the current source to an reference voltage may comprise, converting the voltage which is across the current source from an analogue signal to a digital value, and comparing the digital value to reference digital value which is representative of said reference voltage.

The means for comparing may comprise a first and second comparator, wherein a first input of the first comparator is electrically connected to a junction between the H bridge and current source so that the first input has a voltage equal to the voltage across the current source, and a second input of the first comparator is provided with a first reference voltage; and wherein a second input of the second comparator is electrically connected to a junction between the H bridge and current source so that the second input has a voltage equal to the voltage across the current source, and a first input of the second comparator is provided with a second reference voltage.

The means for comparing may comprise a first, second and third resistor, which are connected in series, and voltage is applied across the first, second and third resistors such that the voltage at a junction between the first and second resistors define the first reference voltage and the voltage at a junction between the second and third resistors define the second reference voltage.

The means for comparing may comprise a first and second digital to analogue convertor, wherein the first and second digital to analogue convertors can receive first and second digital reference inputs respectively, and wherein the output of the first digital convertor defines the first reference voltage and the output of the first digital convertor defines the second reference voltage.

A MEMS mirror device may further comprise a controller which can shut off the MEMS mirror device if an open circuit and/or short circuit is detected.

It will be understood that in each of the above-mentioned embodiment a first input of a comparator will be a positive input node of the comparator and a second input of that comparator will be a negative input node of the comparator. Or, the first input of a comparator will be a negative input node of the comparator and a second input of that comparator will be a positive input node of the comparator.

BRIEF DESCRIPTION OF THE DRAWINGS

The invention will be better understood with the aid of the description of embodiments of the present invention, which are given by way of example only, and illustrated by the figures, in which:

FIG. 2b shows voltages at points A, B, C and D of FIG. 2a;

DETAILED DESCRIPTION OF POSSIBLE EMBODIMENTS OF THE INVENTION

Figure 2A:
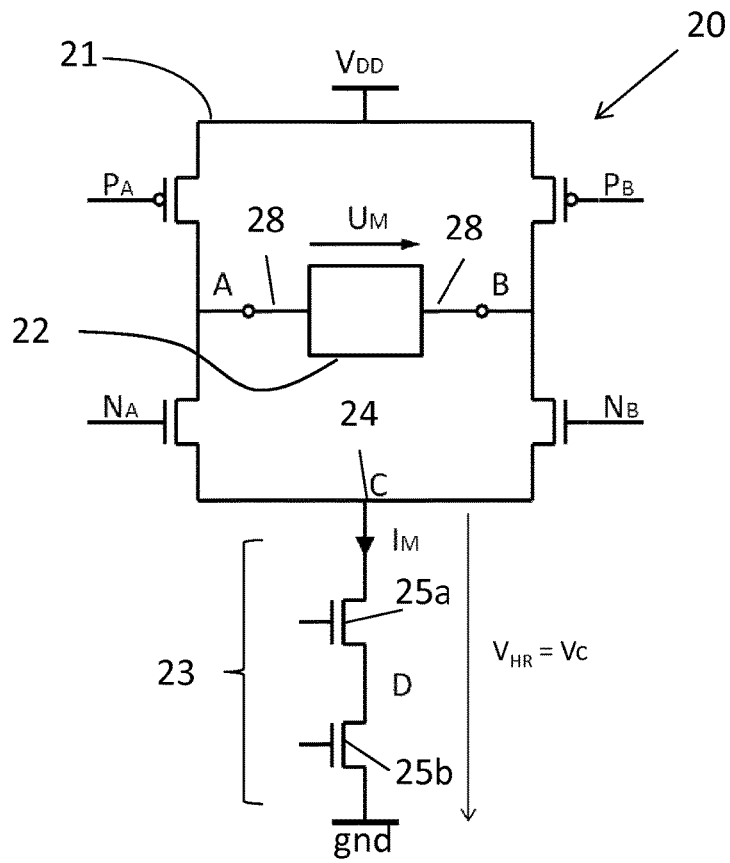
FIG. 2a shows a H-bridge with a MEMS mirror connected as a load to the H bridge, and a current source.

FIG. 2a shows a circuit 20 which comprises a H-bridge circuit 21 with a MEMS micro-mirror 22 connected as a load to the H bridge circuit 21 so that voltage can be selectively applied across the MEMS micro-mirror 22 in either direction.

As is known in the art the H-bridge circuit 21 comprises a first p-transistor ($P_A$) electrically connected in series with a first n-transistor ($N_A$), and a second p-transistor ($P_B$) electrically connected in series with a second n-transistor ($N_B$). The first p- and n-transistors ($P_A,N_A$) are electrically connected in parallel to the second p- and n-transistors ($P_B,N_B$).

The MEMS micro-mirror 22 connected as a load to the H bridge circuit 21 by mean of a conduction coil 28. The conduction coil 28 cooperates with the MEMS micro-mirror 22 and can conduct current in a magnetic field so as to generate a Lorentz force which can oscillate the MEMS micro-mirror 22 about an oscillation axis. The conduction coil 28 therefore actuates the MEMS micro-mirror 22 to oscillate about an oscillation axis by conducting current. The conduction coil 28 is electrically connected to the H-bridge circuit 21 at opposite sides (first and second sides) of the MEMS micro-mirror 22, at points A and B.

The top 26 of the H-bridge circuit 21 is electrically connected to a power source ($V_{DD}$) and the bottom 24 of the H-bridge circuit 21 is electrically connected to a current source 23 which is grounded (gnd). The H-bridge circuit 21 is electrically connected to a current source 23 at point C. The current source 23 comprises a first and second n-transistors 25a,b which are connected in series; the junction between the first and second n-transistors 25a,b is point D.

Figure 2B:
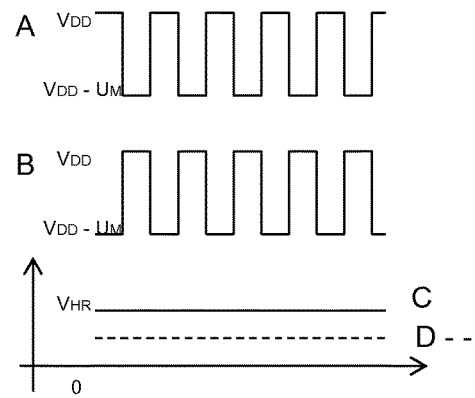

FIG. 2b shows voltages at the points A, B, C and D of the circuit 20 shown in FIG. 2a, when the circuit 20 is in normal operation. During normal operation current will pass either of two routes; the first route is from power source ($V_{DD}$), through the first p-transistor ($P_A$), through the conduction coil 28 from the left to the right hand side of the MEMS micro-mirror 22, through the second n-transistor ($N_B$) and through the current source 23 to ground (gnd); and the second route is from power source ($V_{DD}$), through the second p-transistor ($P_B$), through the conduction coil 28 from the right to the left hand side of the MEMS micro-mirror 22, through the first n-transistor ($N_A$) and through the current source 23 to ground (gnd). For both the first and second routes, a voltage drop ($U_m$) will occur across the MEMS micro-mirror 22 as the current passes through the conduction coil 28; therefore the voltage at A and B will always be opposite in phase (i.e. A and B can have only two values: Vdd or Vdd–Um; so if A is at Vdd, B will be at Vdd–Um, and if A is at Vdd–Um, B will be at Vdd) when current follows along the first route then the voltage at A is equal to Vdd and the voltage at B will be is equal to Vdd–Um; when current follows along the second route then the voltage at A is equal to Vdd–Um the voltage at B will be is equal to Vdd, as is illustrated in the graphs of FIG. 2b.

It should also be noted that the voltages which are at A and B will always be greater than the voltage which is at C ($V_{HR}$) i.e. (Vdd–Um)>$V_{HR}$, and Vdd>$V_{HR}$. Furthermore, the voltage at C ($V_{HR}$) will always be greater than the voltage at D, due to the voltage drop which occurs across the second n-transistor 25b of the current source 23.

Figure 1A:
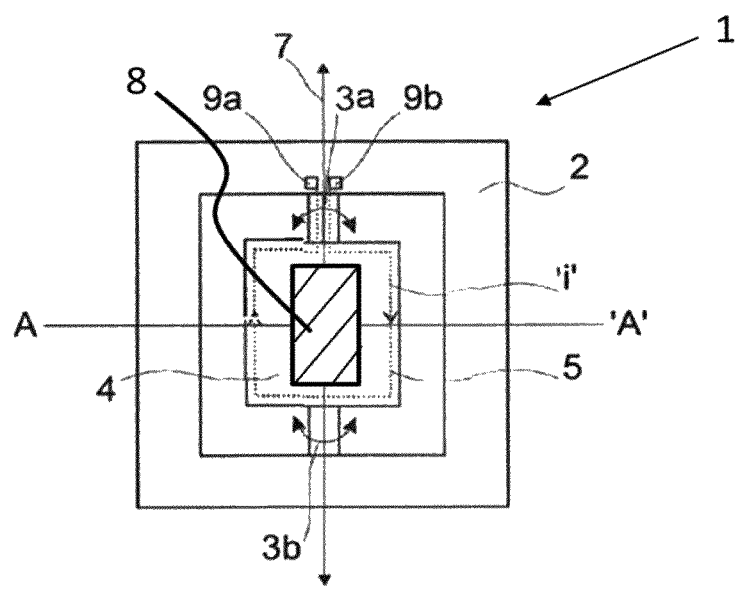
FIG. 1a shows an aerial view of a known MEMS micromirror device.
Figure 1B:
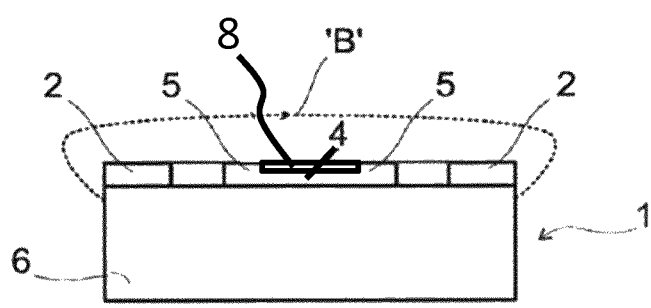
FIG. 1b shown a cross sectional view of the MEMS micro-mirror device shown in FIG. 1a along A-A'.
Figure 3:
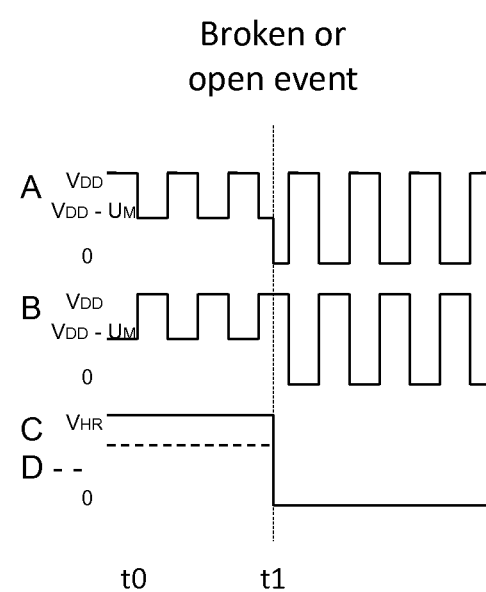
FIG. 3 shows voltages at points A, B, C and D of FIG. 1a in the case of an open circuit occurring in an conduction coil of the MEMS micro-mirror.

FIG. 3 shows voltages at points A, B, C and D of FIG. 1a in the case of an open circuit occurring in the conduction coil 28 of the MEMS micro-mirror 22. When an open circuit occurs the voltage drop across the MEMS micro-mirror 22 becomes $V_{DD}$ (i.e. Um is equal to +$V_{DD}$ or –$V_{DD}$ depending on whether the current is passing along the first or second routes through the H-bridge); thus when the voltage at A is $V_{DD}$ the voltage at B is '0' and when the voltage at B is $V_{DD}$ the voltage at A is '0'. Accordingly, the current through the current source 23 goes to '0', and importantly, the voltage at C becomes equal to the voltage at D, and is equal to '0', as is illustrated in the graphs of FIG. 3.

Figure 4:
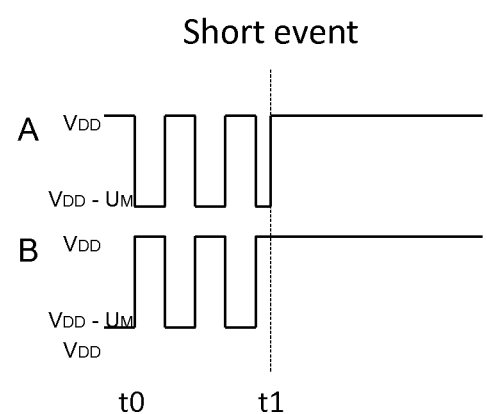
FIG. 4 shows voltages at points A, B, C and D of FIG. 1a in the case of a short circuit occurring in a conduction coil of the MEMS micro-mirror.

FIG. 4 shows voltages at points A, B, C and D of FIG. 1a in the case of a short circuit occurring in the conduction coil 28 of the MEMS micro-mirror 22. As mentioned with reference to FIG. 2b, during normal operation, the voltage at A and B will always be opposite in phase (i.e. A and B can have only two values: Vdd or Vdd–Um; so if A is at Vdd, B will be at Vdd–Um, and if A is at Vdd–Um, B will be at Vdd); when current follows along the first route then the voltage at A is equal to Vdd and the voltage at B will be is equal to Vdd–Um; when current follows along the second route then the voltage at A is equal to Vdd–Um the voltage at B will be is equal to Vdd. However, when a short circuit occurs in the conduction coil 28 of the MEMS micro-mirror 22, A and B will have the same potential; specifically when a short circuit occurs the voltage at A will be equal to Vdd and the voltage at B will be is equal to Vdd, as is illustrated in the graphs of FIG. 4.

Figure 5A:
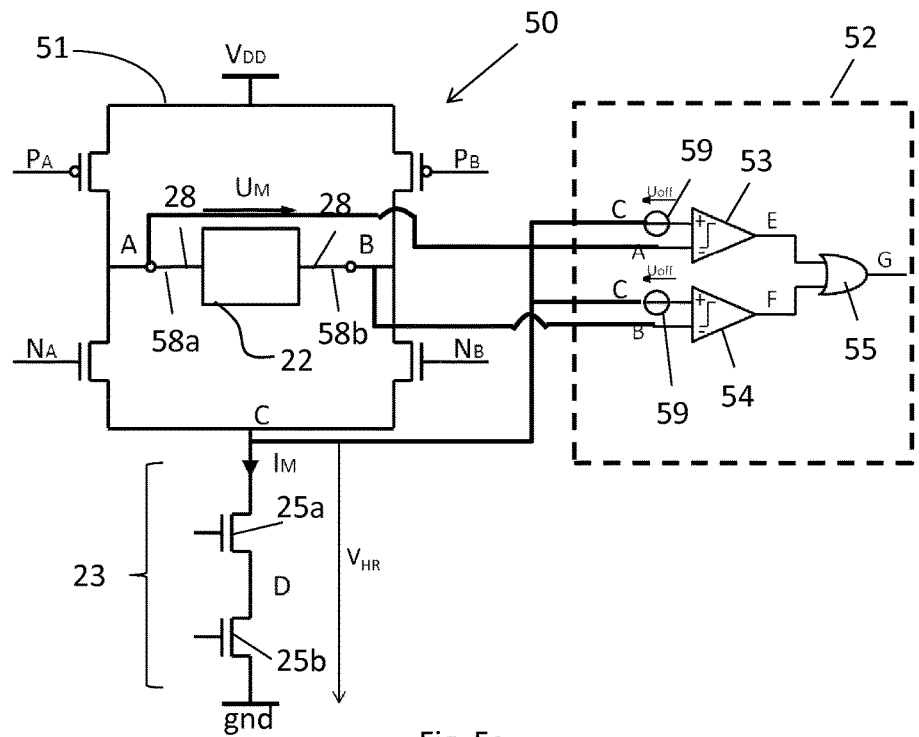
FIG. 5 shows a MEMS mirror device according to a first embodiment of the present invention, in which an open circuit can be detected.

FIG. 5a shows a MEMS micro-mirror device 50 according to a first embodiment of the present invention, in which an open circuit can be detected. The MEMS micro-mirror device 50 comprises a circuit 51 which has all of the features of the circuit 20 shown in FIG. 2a and like features are awarded the same reference numbers.

The MEMS micro-mirror device 50 further comprises a means for comparing 52, which is configured to compare the voltages at first and second sides 58a,58b of the MEMS micro-mirror 22 to the voltage across the current source 23 ($V_{HR}$), so that an open circuit in the MEMS mirror device 50 can be detected. Specifically, the means for comparing 52, compares the voltages at points A and B to the voltage across the current source 23 ($V_{HR}$), so that an open circuit in the MEMS mirror device 50 can be detected.

The means for comparing 52 comprises an IC circuit which comprises a first comparator 53 which has an output (E); a second comparator 54 which has an output (F); and a OR gate 55 which has an output (G). Outputs (E,F) of the first and second comparators 54 are arranged to be input to the OR gate 55. The voltage at the first side 58a of the MEMS micro-mirror 22 (i.e. the voltage at point A) and the voltage across the current source 23 ($V_{HR}$) (i.e. the voltage at point C), are inputs to the first comparator 53, and the voltage at the second side 58b of the MEMS micro-mirror 22 (i.e. the voltage at point B) and the voltage across the current source 23 ($V_{HR}$) (i.e. the voltage at point C), are inputs to the second comparator 54. A voltage offsetting means 59 is further provided for providing an voltage offset (Uoff) to the voltage across the current source 23 ($V_{HR}$) (i.e. the voltage at point C) before it is input to the first and second comparators 23 respectively.

Figure 5B:
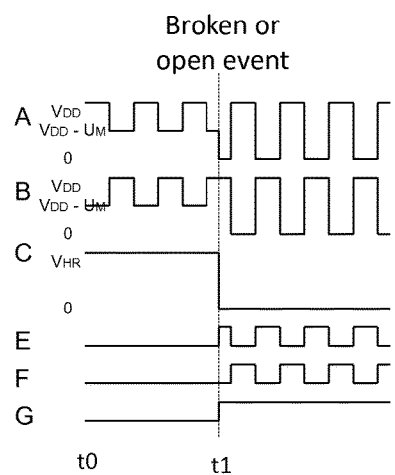

FIG. 5b show the voltages at points A-C and the Boolean values at outputs E-G, of the MEMS micro-mirror device 50 shown in FIG. 5a when an open circuit occurs. At time $t_o$ the MEMS micro-mirror device 50 undergoes normal operation. During normal operation at least one of voltages at points A and B will always be greater than the voltage across the current source 23 ($V_{HR}$) (i.e. the voltage at point C) plus the voltage offset (Uoff) which is the input offset of the comparator (i.e. at least one of voltages at points A and B will always be greater than '$V_{HR}$+Uoff'); accordingly the Boolean values at the outputs E and F will be '0' and the Boolean value at the output of the OR gate 55 will be '0'. The voltage offset (Uoff) is built by a size asymmetry between transistors of the comparator input.

At time $t_1$ an open circuit occurs in the conduction coil 28 of the MEMS micro-mirror 22 which causes the MEMS micro-mirror 22 to stop oscillating. The voltage across the current source 23 ($V_{HR}$) (i.e. the voltage at point C) will go to '0', and the voltages at points A and B will alternately equal $V_{DD}$ and '0' as shown. Accordingly, the voltages at points A and B will alternately be smaller than the voltage across the current source 23 ($V_{HR}$) (i.e. the voltage at point C) plus the voltage offset (Uoff) which is the input offset of the comparator (i.e. the voltages at points A and B will alternately be smaller than '$V_{HR}$+Uoff') causing the Boolean values at outputs E and F to be alternately be 1 and 0, as shown in FIG. 5b. Accordingly the Boolean value at the output G of the OR gate 55 will go to '1' when an open circuit occurs in the conduction coil 28. The detection of an open circuit can be achieved by monitoring the output G of the OR gate 55 for when its Boolean value changes from '0' to '1'.

The MEMS micro-mirror device 50 may further comprise a control unit which is operatively connected to the output G of the OR date 55, and is configured to automatically shut-down the MEMS micro-mirror device 50 when the output G of the OR gate 55 changes from '0' to '1'.

Figure 6A:
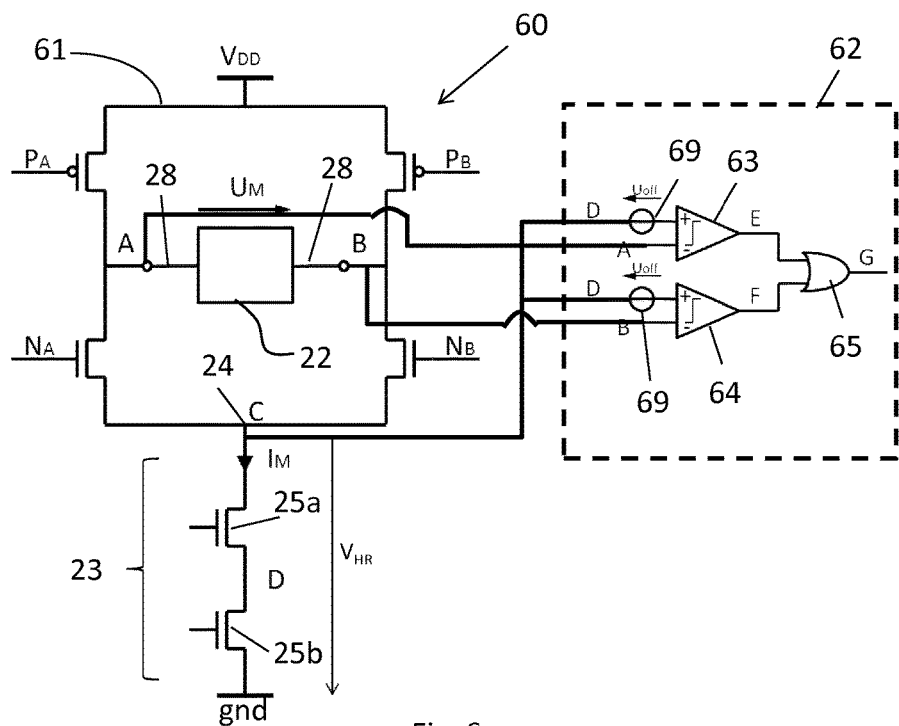
FIG. 6 shows a MEMS mirror device according to a further embodiment of the present invention in which an open circuit can be detected.

FIG. 6a shows a MEMS mirror device 60 according to a further embodiment of the present invention in which an open circuit can be detected. The MEMS mirror device 60 has many of the same features as the MEMS mirror device 50 shown in FIG. 5a, and like features are awarded the same reference numbers. The MEMS micro-mirror device 60 comprises a circuit 61 which has all of the features of the circuit 20 shown in FIG. 2a and like features are awarded the same reference numbers.

The difference between the MEMS mirror device 60 in FIG. 6a and the MEMS mirror device 50 in FIG. 5a is that in the MEMS mirror device 60 the voltage at point D (i.e. the voltage at the junction between the first and second n-transistors 25a,b of the current source 23) is used for the comparison. Specifically, the MEMS mirror device 60 comprises a means for comparing 62 which is configured to compare the voltage at the first side 58a of the MEMS micro-mirror 22 (i.e. the voltage at point A) to the voltage at the junction between the first and second n-transistors 25a,b of the current source 23 (i.e. the voltage at point D), and for comparing the voltage at the second side 58b of the MEMS micro-mirror 22 (i.e. the voltage at point B) to the voltage at the junction between the first and second n-transistors 25a,b of the current source 23 (i.e. the voltage at point D).

The means for comparing 62 comprises an IC circuit which comprises a first comparator 63 which has an output (E); a second comparator 64 which has an output (F); and a OR gate 65 which has an output (G). Outputs (E,F) of the first and second comparators 63,64 are arranged to be input to the OR gate 65. The voltage at the first side 58a of the MEMS micro-mirror 22 (i.e. the voltage at point A) and the voltage at the junction between the first and second n-transistors 25a,b of the current source 23 (i.e. the voltage at point D), are inputs to the first comparator 63, and the voltage at the second side 58b of the MEMS micro-mirror 22 (i.e. the voltage at point B) and the voltage at the junction between the first and second n-transistors 25a,b of the current source 23 (i.e. the voltage at point D), are inputs to the second comparator 64. The voltage offsetting means 69 if further provided to provide an voltage offset (Uoff) to the voltage at the junction between the first and second n-transistors 25a,b of the current source 23 (i.e. the voltage at point D) before it is input to the first and second comparators 63,64 respectively.

Figure 6B:
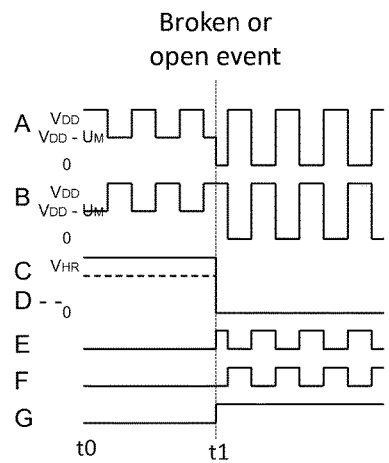

FIG. 6b show the voltages at points A-D and the Boolean values at outputs E-G, of the MEMS micro-mirror device 60 shown in FIG. 6a when an open circuit occurs. At time $t_o$ the MEMS micro-mirror device 60 undergoes normal operation. During normal operation at least one of voltages at points A and B will always be greater than the voltage at the junction between the first and second n-transistors 25a,b of the current source 23 (i.e. the voltage at point D) plus the voltage offset (Uoff) which is the input offset of the comparator (i.e. at least one of voltages at points A and B will always be greater than 'Voltage at point D+Uoff'); accordingly the Boolean values at the outputs E and F will be '0' and the Boolean value at the output of the OR gate 65 will be '0'.

At time $t_1$ an open circuit occurs in the conduction coil 28 of the MEMS micro-mirror 22 which causes the MEMS micro-mirror 22 to stop oscillating. The voltage across the current source 23 ($V_{HR}$) (i.e. the voltage at point C) and therefore also the voltage at the junction between the first and second n-transistors 25a,b of the current source 23 (i.e. the voltage at point D), will go to '0'. The voltages at points A and B will alternately equal $V_{DD}$ and '0' as shown in FIG. 6b. Accordingly, the voltages at points A and B will alternately be smaller than the voltage at point D plus the voltage offset (Uoff) which is the input offset of the comparator causing the Boolean values at outputs E and F to be alternately be 1 and 0, as shown in FIG. 6b. Accordingly the Boolean value at the output G of the OR gate 65 will go to '1' when an open circuit occurs in the conduction coil 28. The detection of an open circuit can be achieved by monitoring the output G of the OR gate 65 for when its Boolean value changes from '0' to '1'.

The MEMS micro-mirror device 60 may further comprise a control unit which is operatively connected to the output G of the OR gate 65, and is configured to automatically shut-down the MEMS micro-mirror device 60 when the output G of the OR gate 65 changes from '0' to '1'

The advantage of using the voltage at D for doing the comparison instead of using the voltage at point C, is that when measuring at point C the minimum voltage between point A and Point C or minimum voltage between point B and Point C, is a few tens of millivolts only; which means that to be able to compare the voltages at points A and C or the voltages at points B and C, the comparator internal offset has to be below few tens of millivolts, which is very difficult to achieve. On the other side, the voltage between C and D is around 200 mV, therefore the voltage between A and D or B and D will be around 200 mV instead of few tens of mW. In that case one can design a comparator which has a more relaxed constrain on its internal offset value, for example 100 mV, that will then be easier and cheaper to design, as well as being more robust to manufacturing tolerances. Indeed, a comparator which has low input offset value, for example less than 50 mV input offset at all temperatures and process variations needs more silicon area and more consumption. As a result, the voltage between point A and point D (Va–Vd; respectively Vb–Vd) is higher than the voltage between point A and point C (Va–Vc; respectively Vb–Vc) because with this solution voltage between point A and point D (Va–Vd) is effectively Va–Vc+Vc–Vd (respectively Vb–Vd is effectively Vb–Vc+Vc–Vd). So in this solution it is easier to design a comparator that compares higher signals, where the solution enables to have the signal being a part of 50 mV more than before.

Figure 7A:
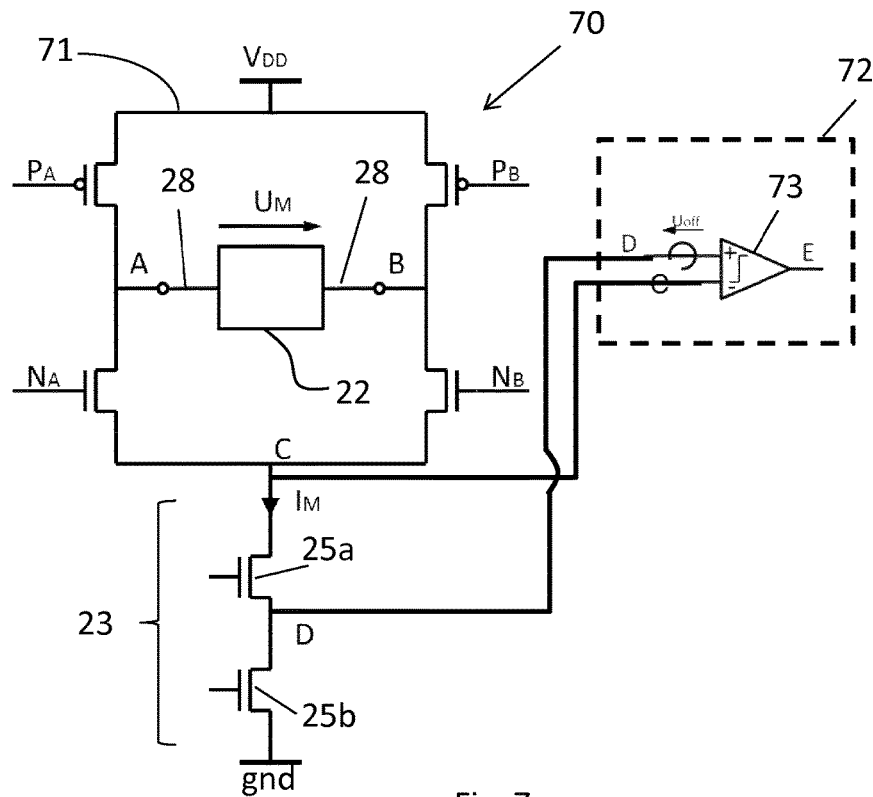
FIG. 7 shows a MEMS mirror device according to a further embodiment of the present invention in which an open circuit can be detected.

FIG. 7a shows a MEMS micro-mirror device 70 according to a further embodiment of the present invention, in which an open circuit can be detected. The MEMS micro-mirror device 70 comprises a circuit 71 which has all of the features of the circuit 20 shown in FIG. 2a and like features are awarded the same reference numbers.

The MEMS micro-mirror device 70 further comprises a means for comparing 72, which is configured to compare the voltage at the junction between the first and second n-transistors 25a,b of the current source 23 (i.e. the voltage at point D) to the voltage across the current source 23 ($V_{HR}$), so that an open circuit in the MEMS mirror device 70 can be detected.

The means for comparing 72 comprises an IC circuit which comprises a single comparator 73 which has an output (E). The voltage at the junction between the first and second n-transistors 25a,b of the current source 23 (i.e. the voltage at point D) and the voltage across the current source 23 ($V_{HR}$) (i.e. the voltage at point C), are inputs to the single comparator 73. A voltage offsetting means 59 is further provided for providing an voltage offset (Uoff) to the voltage at the junction between the first and second n-transistors 25a,b of the current source 23 (i.e. the voltage at point D) before it is input to single comparator 73.

Figure 7B:
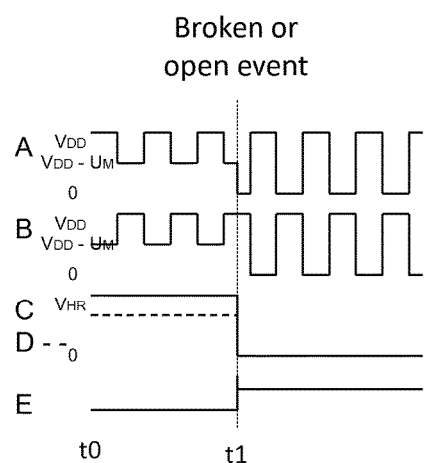

FIG. 7b show the voltages at points A-D and the Boolean values at output E of the single comparator 73, of the MEMS micro-mirror device 70 shown in FIG. 7a when an open circuit occurs. At time $t_o$ the MEMS micro-mirror device 70 undergoes normal operation. During normal operation the voltage at point C will always be greater than the voltage at point D plus the voltage offset (Uoff) which is the input offset of the comparator (i.e. the voltage at point C will always be greater than 'Voltage at point D+Uoff'); accordingly the voltages at points C and D will always differ and thus the Boolean value at the output E of the single comparator 73 will be '0'.

At time $t_1$ an open circuit occurs in the conduction coil 28 of the MEMS micro-mirror 22 which causes the MEMS micro-mirror 22 to stop oscillating. The voltage across the current source 23 ($V_{HR}$) (i.e. the voltage at point C) and therefore also the voltage at the junction between the first and second n-transistors 25a,b of the current source 23 (i.e. the voltage at point D), will both go to '0'. The voltages at points C and D will therefore become equal and thus the Boolean value at the output Eof the single comparator 73 will change from '0' to '1'. Thus in the MEMS micro-mirror device 70 an open circuit can be detected by monitoring for a change in the output E of the single comparator 73 from '0' to '1'.

The MEMS micro-mirror device 70 may further comprise a control unit which is operatively connected to the output E of the single comparator 73, and which is configured to automatically shut-down the laser light source, and/or the laser driver and/or the MEMS micro-mirror device 70, when the output E of the single comparator 73 changes from '0' to '1'.

FIG. 8 shows a MEMS mirror device 80 according to a further embodiment of the present invention in which a short circuit can be detected. The MEMS micro-mirror device 80 comprises a circuit 81 which has all of the features of the circuit 20 shown in FIG. 2a and like features are awarded the same reference numbers.

The MEMS micro-mirror device 80 further comprises a means for comparing 82 which is configured to compare the voltages at first and second sides 58a, 58b of the MEMS micro-mirror 22 to each other, so that an open circuit in the MEMS mirror device 50 can be detected. Specifically, the means for comparing 82, compares the voltage at point A to the voltage a B, so that an open circuit in the MEMS mirror device 80 can be detected.

The means for comparing 82 comprises an IC circuit which comprises a first comparator 83 which has an output (H); a second comparator 84 which has an output (I); and a XNOR gate 85 which has an output (J). Outputs (H,I) of the first and second comparators 83,84 are arranged to be input to the XNOR gate 85. The voltage at the first side 58a of the MEMS micro-mirror 22 (i.e. the voltage at point A) and the voltage at the second side 58b of the MEMS micro-mirror 22 (i.e. the voltage at point B) are first and second inputs to the first comparator 83 respectively. The voltage at the second side 58b of the MEMS micro-mirror 22 (i.e. the voltage at point B) and the voltage at the first side 58b of the MEMS micro-mirror 22 (i.e. the voltage at point A) are first and second inputs to the second comparator 84 respectively. It will be understood that in this example, a first input is an input to the positive node of a comparator and a second input is an input to the negative node of a comparator; however it will be understood that alternatively, a first input may be an input to the negative node of a comparator and a second input may an input to the positive node of a comparator.

A voltage offsetting means 89 is further provided for providing a voltage offset (Uoff) to the voltage at point A before it is input to the first comparators 83 and for providing a voltage offset (Uoff) to the voltage at point B before it is input to the second comparators 84. Alternatively the voltage offset (Uoff) may be provided by the comparator 84; the voltage offset (Uoff) may be an input offset of the comparator 84.

Figure 8A:
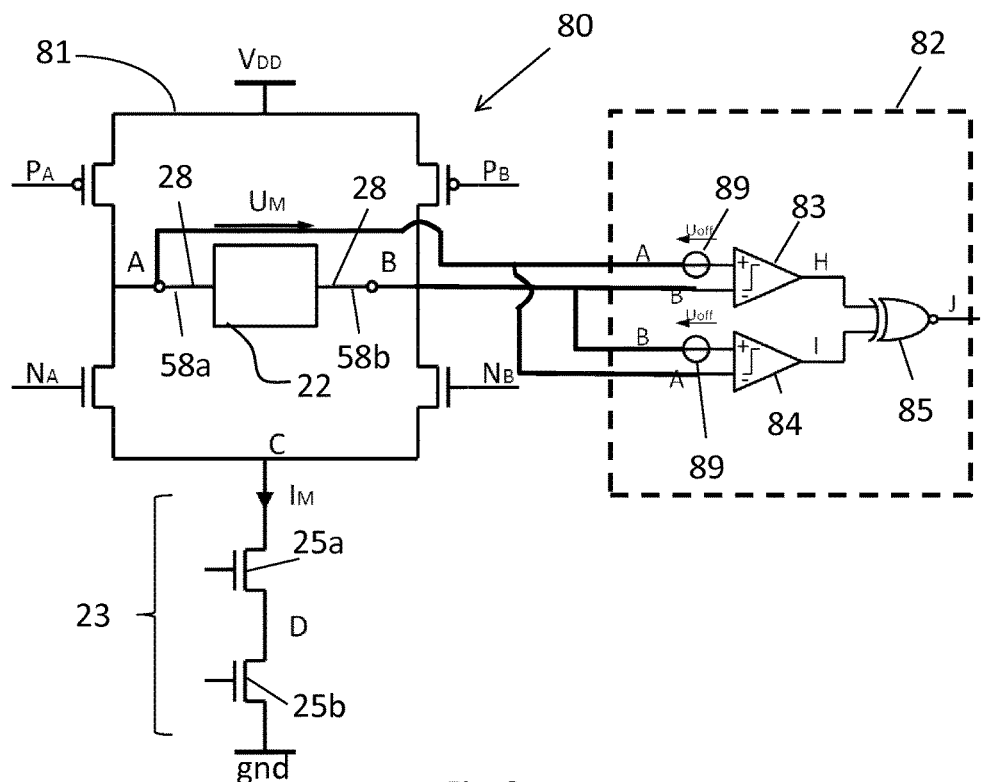
FIG. 8 shows a MEMS mirror device according to a further embodiment of the present invention in which a short circuit can be detected.
Figure 8B:
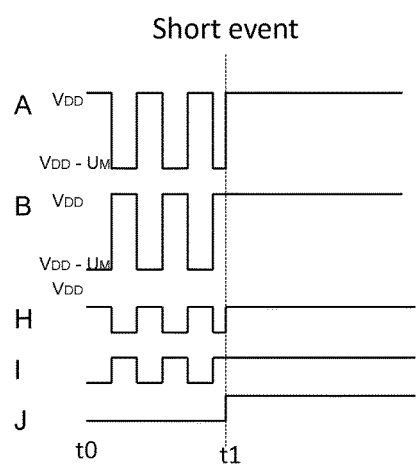

FIG. 8b show the voltages at points A and B and the Boolean values at outputs H-J, of the MEMS micro-mirror device 80 shown in FIG. 8a when an short circuit occurs. At time $t_o$ the MEMS micro-mirror device 80 undergoes normal operation. During normal operation one of voltages at points A and B will always be greater than the other; accordingly the outputs H and I will always have opposite phase; specifically, when the output H is '1' the output I will be '0' during normal operation. Accordingly the output J of the XNOR gate will always be '0' during normal operation of the MEMS micro-mirror device 80.

At time $t_1$ a short circuit occurs in the conduction coil 28 of the MEMS micro-mirror 22 which causes the MEMS micro-mirror 22 to stop oscillating. The occurrence of the short circuit will cause both the voltage at point A and the voltage at point B to both go to $V_{DD}$, as is illustrated in FIG. 8b. The voltages at points A and B will thus become equal, and the outputs H,I of both first and second comparators 83,84 will both go to '1'; accordingly the output J of the XNOR gate 85 will change from '0' to '1'. The detection of an short circuit in the MEMS micro-mirror device 80 can be thus be achieved by monitoring the output J of the XNOR gate 85 for when its Boolean value changes from '0' to '1'.

The MEMS micro-mirror device 80 may further comprise a control unit which is operatively connected to the output J of the XNOR gate 85, and which is configured to automatically shut-down the laser light source, and/or the laser driver and/or the MEMS micro-mirror device 80 when the output J of the XNOR gate 85 changes from '0' to '1'.

Figure 9A:
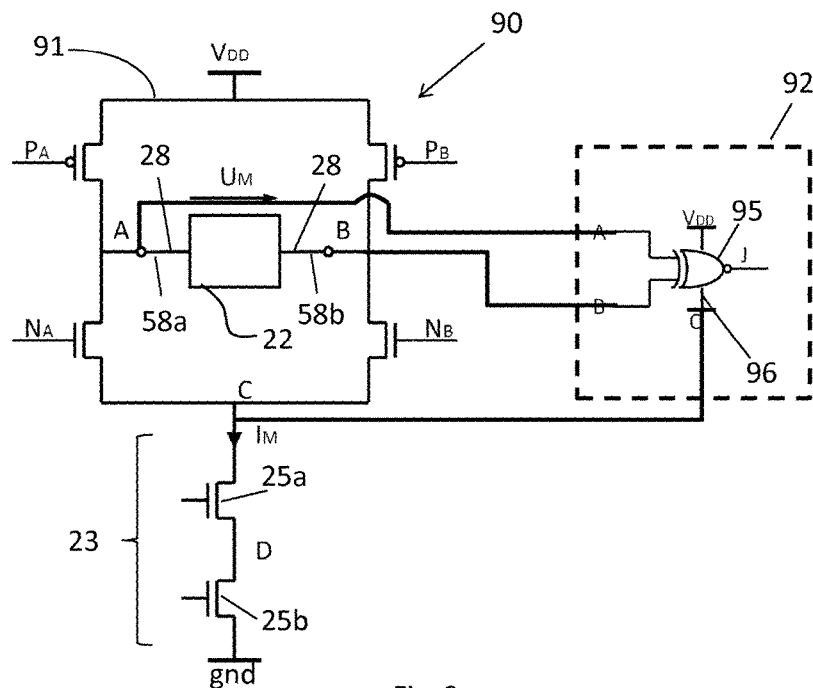
FIG. 9 shows a MEMS mirror device according to a further embodiment of the present invention in which a short circuit can be detected.

FIG. 9a shows a MEMS mirror device 90 according to a further embodiment of the present invention in which a short circuit can be detected. The MEMS micro-mirror device 90 comprises a circuit 91 which has all of the features of the circuit 20 shown in FIG. 2a and like features are awarded the same reference numbers.

The MEMS micro-mirror device 90 further comprises a means for comparing 92 which is configured to compare the voltages at first and second sides 58a, 58b of the MEMS micro-mirror 22 to each other, so that an open circuit in the MEMS mirror device 50 can be detected. Specifically, the means for comparing 92, compares the voltage at point A to the voltage a B, so that an open circuit in the MEMS mirror device 90 can be detected.

The means for comparing 92 comprises a single XNOR gate 95 which has an output (J). The XNOR gate 95 comprises a ground pin 96, which is electrically connected to point C so that the ground pin 96 of the XNOR gate 95 is at kept at the same potential as the voltage across the current source 23. Optionally a buffer may be electrically connected between the point C and the ground pin 96. The XNOR gate 95 comprises a drive pin 97 which is connected to the power source ($V_{DD}$).

If the voltage UM is greater than the transition of an NMOS transistor, the detection circuit can be a XNOR gate, with its ground connected to the point C.

A first input 98a of the XNOR gate 95 is electrically connected to the first side 58a of the MEMS micro-mirror 22, a second input 98b of the XNOR gate 95 is electrically connected to the second side 58a of the MEMS micro-mirror 22. So the voltage at the first side 58a of the MEMS micro-mirror 22 (i.e. the voltage at point A) and the voltage at the second side 58b of the MEMS micro-mirror 22 (i.e. the voltage at point B) both form the inputs to the XNOR gate 95.

Figure 9B:
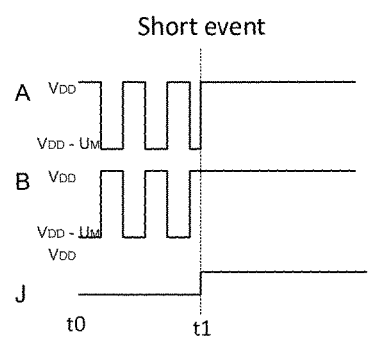

FIG. 9b illustrates the voltages at points A and B and the Boolean values at output J of the XNOR gate 95, when a short circuit occurs. At time $t_o$ the MEMS micro-mirror device 90 undergoes normal operation. During normal operation the voltage at A and B will always be opposite in phase (i.e. A and B can have only two values: Vdd or Vdd–Um; so if A is at Vdd, B will be at Vdd–Um, and if A is at Vdd–Um, B will be at Vdd); when current follows along the first route through the H-bridge circuit 91 then the voltage at A is equal to $V_{DD}$ and the voltage at B is equal to $V_{DD}$–Um; when current follows along the second route through the H-bridge circuit 91 then the voltage at A is equal to $V_{DD}$–Um the voltage at B is equal to $V_{DD}$ (wherein Um is the voltage drop across the MEMS micro-mirror 22) as is illustrated in the graphs FIG. 9b. Accordingly the output J of the XNOR gate 95 will always be 'O' during normal operation of the MEMS micro-mirror device 80.

At time $t_1$ a short circuit occurs in the conduction coil 28 of the MEMS micro-mirror 22 which causes the MEMS micro-mirror 22 to stop oscillating. The occurrence of the short circuit will cause both the voltage at point A and the voltage at point B to both go to $V_{DD}$, as is illustrated in FIG. 9b. The voltages at points A and B will thus become equal, and the output J of the XNOR gate 95 will thus change from '0' to '1'. The detection of a short circuit in the MEMS micro-mirror device 80 can be thus be achieved by monitoring the output J of the XNOR gate 95 for when its Boolean value changes from '0' to '1'.

The MEMS micro-mirror device 90 may further comprise a control unit which is operatively connected to the output J of the XNOR gate 95, and which is configured to automatically shut-down the laser light source, and/or the laser driver and/or the MEMS micro-mirror device 90 when the output J of the XNOR gate 95 changes from '0' to '1'.

Figure 10A:
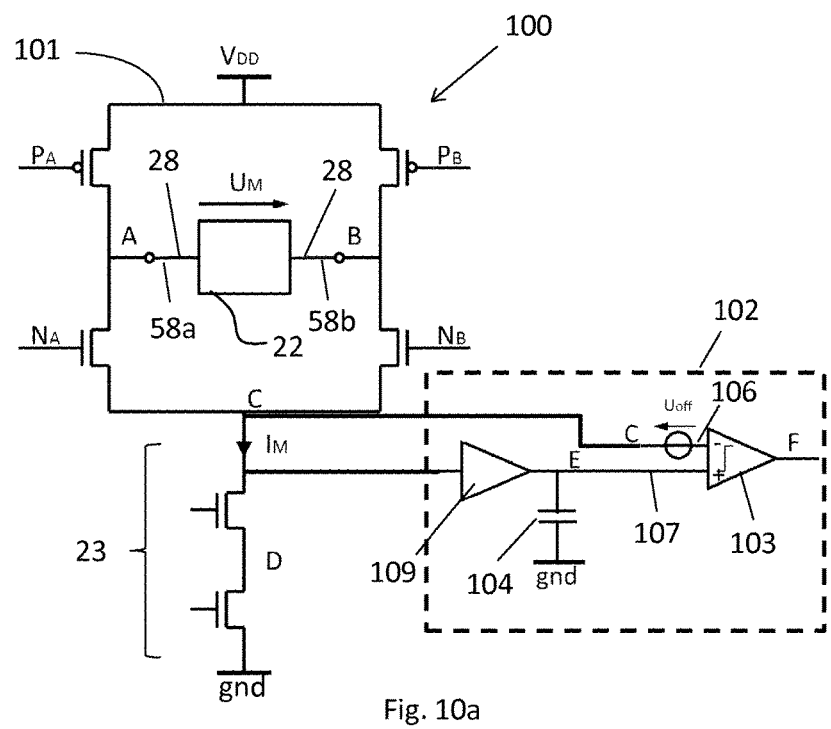
FIG. 10 shows a MEMS mirror device according to a further embodiment of the present invention in which a short circuit, as well as a partial short circuit, can be detected.

FIG. 10a shows a MEMS mirror device 100 according to a further embodiment of the present invention in which a short circuit, as well as a partial short circuit, can be detected.

A Short circuit in the conduction coil 23 occurs when the resistance of the conduction coil 23 is close to, or equal to, 0Ω (Ohm); this can occur if conducting material with very low resistance electrically connects points A and B, thus shorting out the conduction coil 23. A partial short circuit is when the resistance of the conduction coil 23 is decreasing because parts of the conduction coil 23 are being electrically connected to each other. The problem with a partial short circuit is that for the same current conducted in the conduction coil 23, the Lorentz force acting on the MEMS micro-mirror 22 will be lowered and thus the amplitude of oscillation of the MEMS micro-mirror 22 will decrease and the angle over which the light beams are scanned will decrease. A short circuit or a partial short circuit can happen for example due to electro-migration in the conduction coil 23, or mechanical deformation of the conduction coil 23, leading to physical contact between different parts of the conduction coil 23.

The MEMS micro-mirror device 100 comprises a circuit 101 which has all of the features of the circuit 20 shown in FIG. 2a and like features are awarded the same reference numbers. The MEMS micro-mirror device 90 further comprises a means for comparing 102.

The means for comparing 102 is configured to compare voltage across the current source 23 (i.e. the voltage at point C) to a reference voltage to detect a short circuit in the MEMS mirror device. In this particular example the reference voltage is the average value of the voltage across a current source 23 over a predefined period of time (i.e. the average of the voltage at point C over a predefined period of time).

Specifically, the means for comparing 102 comprises, a comparator 103 which has a first and second input 106,107 and an output F; and a low pass filter 104 which is electrically connected to a junction (i.e. point C) which is between the H bridge circuit 101 and current source 23 (i.e. the low pass filter 104 is electrically connected to point C). The low pass filter 104 is grounded (i.e. connected to gnd) or is connected to Vdd. A buffer 109 is further electrically connected between said junction (i.e. point C) and capacitor 104, as is illustrated in FIG. 10a. The buffer 109 will ensure that parasitic voltage from the low pass filter 104 will not affect the voltage across the current source 23 (i.e. the voltage at point C). In the present invention the low pass filter 104 comprises a capacitor, but it will be understood that the low pass filter 104 may comprise any other suitable configuration or combination of components e.g. a combination of capacitors and resistors. The average of the voltage at point C over a predefined period of time is achieved by the low pass filter 104; the period of time depends on the time constant of the low pass filter 104. The low pass filter 104 is preferably designed in order to attenuate the variations due to the induced voltage and therefore provide a single constant signal with a constant value, instead of a sinus shape signal (which is the case of the induced voltage signal at point C). For example, to have 20 dB attenuation, a first order low pass filter needs a resistor (which has an electrical resistance R) and a capacitance (which has an electrical capacitance C) where the average period is ten times the MEMs mirror oscillation period [i.e. 10*MEMS mirror oscillation period=2*pi*R*C]. All the MEMS mirror oscillations which have a higher frequency than ½"*pi*R*C are attenuated therefore only the average value remains after the filter. A higher order filter can be used, with the benefit of reducing the ripple on the average value signal.

The first input 106 of the comparator 103 is electrically connected to the junction (i.e. point C) between the H bridge 101 and current source 23 so that the first input 106 to the comparator 103 is at a voltage which is equal to the voltage across the current source 23 (i.e. the voltage at point C is applied to the first input 106 of the comparator 103). The second input 107 to the comparator 103 is electrically connected to the low pass filter 104 so that the second input 107 to the comparator 103 is at a voltage which is equal to the voltage across the low pass filter 104 (i.e. the voltage at point E). The low pass filter 104 can store previous voltages that were across the current source 23 (i.e. can store the average voltage value of the point C, with eventually a residual oscillation depending on the time constant of the low pass filter 104). The voltage across the low pass filter 104 (i.e. the voltage at point E) is therefore equal to the average value for the voltage across a current source 23 over a predefined period of time. The MEMS mirror device 100 further comprises a voltage offsetting means 111 for providing a voltage offset (Uoff) to the voltage at point E in the comparator 103. Alternatively the voltage offset (Uoff) may be provided by the input to the comparator 103 i.e. as an input offset of the comparator 103. The voltage offset (Uoff) ensures that factors such as temperature change in of the MEMS mirror device 100 will not cause the voltage across the current source 23 (i.e. the voltage at point C) to exceed the voltage at E plus the voltage offset; in other words the offset (Uoff) will ensure that the voltage at point C will be larger than 'Voltage at E'+'Uoff' during normal operation when there is no short circuit or partial short circuit in the MEMS mirror device 100).

Figure 10B:
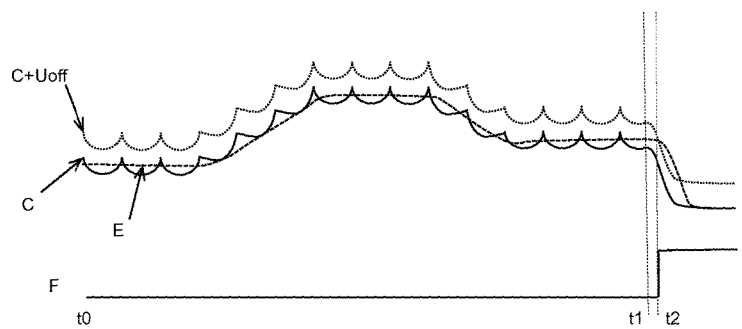

FIG. 10b illustrates the voltages at points C and E; and also illustrates the voltage at E plus offset (Uoff). At time $t_o$ the MEMS micro-mirror device 100 undergoes normal operation. During normal operation the voltage the value 'Voltage at E'+'Uoff' at the second input 107 of the comparator 103 will always be larger than the voltage at point C at the first input 106 to the comparator 103. Therefore the output F of the comparator will be '0'.

At time $t_1$ a partial short circuit occurs in the conduction coil 28 of the MEMS micro-mirror 22 which causes resistance of the conduction coil 28 to decrease and thus the voltage across the MEMS micro-mirror 22 to decrease. As the voltage across the MEMS micro-mirror 22 to decreases the voltage across the current source 23 (i.e. the voltage at point C) will correspondingly increase. At time $t_2$ the voltage across the current source 23 (i.e. the voltage at point C) has increased to the point where it exceeds the value 'Voltage at E'+'Uoff'; thus the voltage at point C at the first input 106 to the comparator 103 will now exceed the value 'Voltage at E'+'Uoff' at the second input 107 of the comparator 103. Accordingly the output F of the comparator 103 will change from '0' to '1'.

The MEMS micro-mirror device 100 may further comprise a control unit which is operatively connected to the output F of comparator 103, and which is configured to automatically shut-down the laser light source, and/or the laser driver and/or the MEMS micro-mirror device 100 when the output F of comparator 103 changes from '0' to '1'.

By crossing the inputs of the comparator, the circuit shown on FIG. 10 may detect if the MEMs micro-mirror 22 becomes blocked so that it no longer oscillates about its oscillation axis. This is because once the MEMS micro-mirror 22 becomes blocked, the temperature of the MEMS micro-mirror 22 will increase dramatically since there is no air cooling effect due to oscillation. The increase in temperature will cause a decrease in the voltage across the current source 23 (i.e. causes an increase in the voltage Um, so a decrease in the voltage at point C) to the point where the value 'Voltage at C'+'Uoff' falls below the voltage at point E; thus the voltage at point C+Uoff at the input 107 (understood that the offset 'Uoff' is built into the comparator) of the comparator 103 will now fall below the voltage at point E at the input 106 of the comparator 103. Accordingly the output F of the comparator 103 will change from '0' to '1'.

Figure 11:
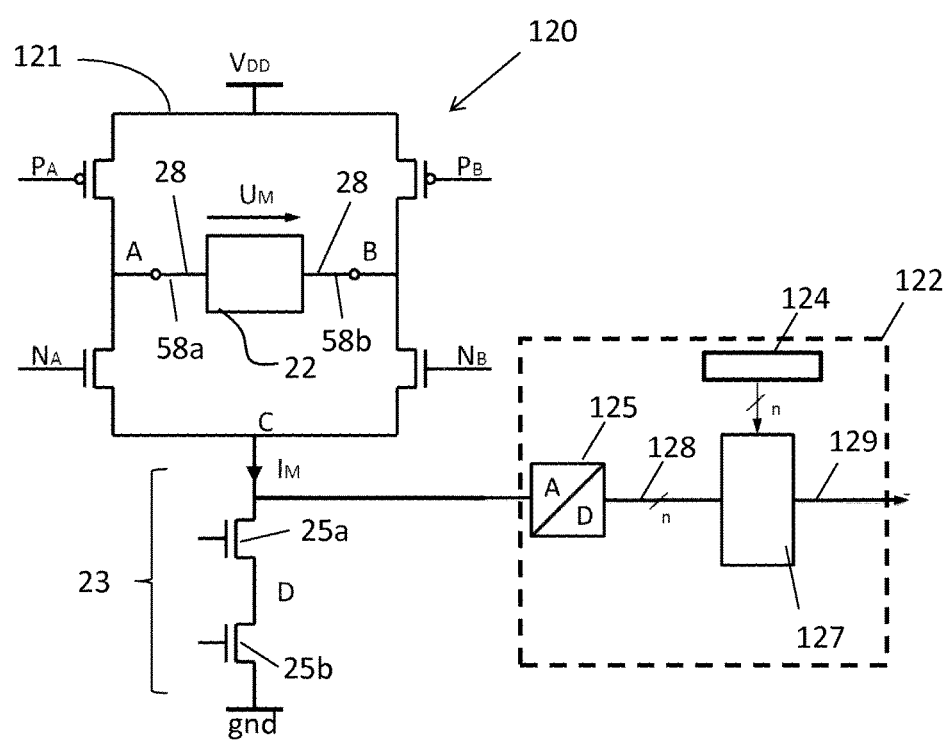
FIG. 11 shows a MEMS mirror device according to a further embodiment of the present invention in which a short circuit, as well as a partial short circuit, can be detected.

FIG. 11 shows a MEMS mirror device 120 according to a further embodiment of the present invention in which a short circuit, as well as a partial short circuit, can be detected. The MEMS micro-mirror device 120 comprises a circuit 121 which has all of the features of the circuit 20 shown in FIG. 2a and like features are awarded the same reference numbers.

The MEMS micro-mirror device 120 further comprises a means for comparing 122. The means for comparing 122 is configured to compare voltage across the current source 23 (i.e. the voltage at point C) to a reference digital value representative of a reference voltage, to detect a short circuit, partial short circuit or a blockage in the MEMS mirror device. Specifically, the means for comparing 102 comprises, an analogue-to-digital converter 125 which is electrically connected to the junction between the H bridge circuit 121 and current source 23 (i.e. electrically connected to point C) so that the analogue-to-digital converter 125 can convert the voltage across the current source 23 (i.e. the voltage at point C) to a digital value. The analogue-to-digital converter 125 will therefore a digital value for the voltage at point C at its output 128. The means for comparing 102 further comprises a comparator 127 which has an output 129. The comparator 127 is arranged to compare the digital value for the voltage at point C, to a reference digital value representative of a reference voltage. The reference digital value is predefined and stored in a memory 124 which the comparator 127 can access; the reference digital value may be stored in the memory 124 at the manufacturing stage. If the digital value for the voltage at point C is less than the reference digital value representative of a reference voltage, then the output 129 of the comparator 127 will be '0'; and if the digital value for the voltage at point C is greater than the reference digital value representative of a reference voltage, then the output 129 of the comparator 127 will be '1' (or vice versa).

During normal operation of the MEMS micro-mirror device 120 the digital value for voltage at point C will always be less than the reference digital value representative of a reference voltage. Accordingly the output 129 of the comparator 127 will be a Boolean value '0'.

If a short or partial short circuit occurs in the conduction coil 28 of the MEMS micro-mirror 22 this will cause the resistance of the conduction coil 28 to decrease and thus cause the voltage across the MEMS micro-mirror 22 to decrease. As the voltage across the MEMS micro-mirror 22 decreases the voltage across the current source 23 (i.e. the voltage at point C) will correspondingly increase. As the voltage at point C increases the digital value for the voltage at point C which is output from the analogue-to-digital converter 125 will increase so that it exceeds the reference digital value representative of a reference voltage. Accordingly the output 129 of the comparator 127 will change from a Boolean value '0' to a Boolean value '1'. The occurrence of a short or partial short can thus be detected by monitoring for a change in the output 129 of the comparator 127 e.g. from a Boolean value '0' to a Boolean value '1' (or from a Boolean value '1' to a Boolean value '0').

The MEMS micro-mirror device 120 may further comprise a control unit which is operatively connected to the output 129 of the comparator 127, and which is configured to automatically shut-down the MEMS micro-mirror device 120 when the output 129 of comparator 127 changes e.g. from a Boolean value '0' to a Boolean value '1' (or from a Boolean value '1' to a Boolean value '0').

It will be understood that the embodiments shown in FIG. 11 may also be used to detect if the MEMS micro-mirror 22 becomes blocked so that it no longer oscillates about its oscillation axis. This is because once the MEMS micro-mirror 22 becomes blocked, the temperature of the MEMS micro-mirror 22 will increase dramatically since there is no air cooling effect due to oscillation. The increase in temperature will cause an increase in the voltage across the current source 23 (i.e. causes an increase in the voltage at point C). As the voltage at point C increases the digital value for the voltage at point C which is output from the analogue-to-digital converter 125 will increase so that it exceeds the reference digital value representative of a reference voltage. Accordingly the output 129 of the comparator 127 will change from a Boolean value '0' to a Boolean value '1'. In this case it preferable to know in advance the value for the resistance of the conduction coil 23 for various different temperatures so that account can be taken for the changes in the resistance of the conduction coil 23 due to temperature changes in the MEMS micro-mirror device 120; a method of the present invention may therefore include the step of measuring the the resistance of the conduction coil 23 at a plurality of different temperatures.

In this embodiment the digital value for the voltage at point C is compared to the reference digital value representative of a reference voltage which is stored in a memory. The electrical resistance of the conduction coil 23 changes due to the temperature, a new reference digital value representative of a new reference voltage should preferably be used for the comparison. This new reference voltage value can be determined by knowing the relation between the temperature and the coil resistance (then using the Ohm's law U=RI relationship to calculate U as function of the coil resistance (R) value, the current passing through the coil (I) is set to remain constant whatever the temperature, and the voltage (U) at the mirror ends. A table listing the resistance of the conduction coil 23 at different temperatures can be generated in a calibration step in which the resistance of the conduction coil 23 is measured at different temperatures.

Figure 12:
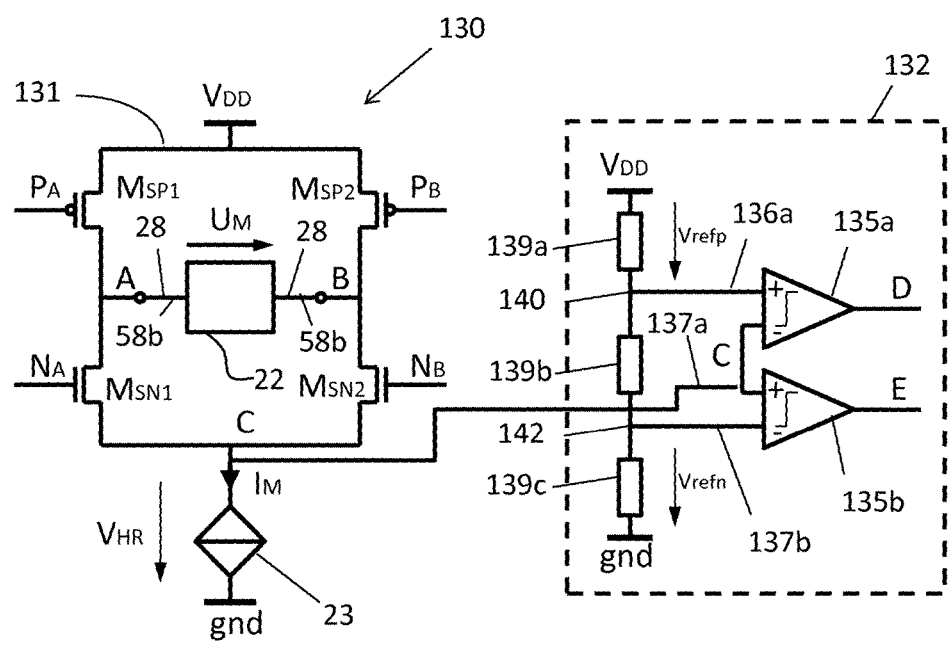
FIG. 12 shows a MEMS mirror device according to a further embodiment of the present invention in which a short and open circuit can be detected.

FIG. 12 shows a MEMS mirror device 130 according to a further embodiment of the present invention in which a short and open circuit can be detected.

The MEMS micro-mirror device 130 comprises a circuit 131 which has all of the features of the circuit 20 shown in FIG. 2a and like features are awarded the same reference numbers. The MEMS micro-mirror device 130 further comprises a means for comparing 132.

The means for comparing 132 is configured to compare voltage across the current source 23 (i.e. the voltage at point C) to an reference voltage to detect a short circuit in the MEMS mirror device. Specifically, the means for comparing 132 comprises a first and second comparators 135a,b which comprise outputs D and E respectively. A second input 136b of the first comparator 135a is electrically connected to a junction between the H bridge 131 and current source 23 so that the second input 136b has a voltage equal to the voltage across the current source 23 (i.e. the second input 136b has a voltage equal the voltage at point C), and a first input 136a of the first comparator 135a is provided with a first reference voltage (Vrefp). A first input 137a of the second comparator 135b is electrically connected to a junction between the H bridge 131 and current source 23 so that the first input 137a has a voltage equal to the voltage across the current source 23 (i.e. the first input 137a has a voltage equal to the voltage at point C), and a second input 137b of the second comparator 135b is provided with a second reference voltage (Vrefn).

In order to provide the first (Vrefp) and second (Vrefn) reference voltages the means for comparing 132 comprises a first, second and third resistor 139a-c, which are connected in series, and voltage ($V_{DD}$) is applied across the first, second and third resistors 139a-c such that the voltage at a junction 140 between the first and second resistors 139,b define the first reference voltage (Vrefp) and the voltage at a junction 142 between the second and third resistors 139b,c define the second reference voltage (Vrefn). Alternatively the first (Vrefp) and second (Vrefn) reference voltages can each be provided by outputs of a first and second digital convertor respectively; the first (Vrefp) and second (Vrefn) reference voltages can be changed more easily be adjusting the digital inputs to the first and second digital convertors. During normal operation of the MEMS micro-mirror device 130 the voltage at point C is always larger than the first and second reference voltages, therefore the outputs D,E of the first and second comparators 135a,b will be Boolean value '1'. In the case an short circuit in the MEMS micro-mirror device 130 occurs the voltage at point C will exceed the first reference voltage (Vrefp) and the output D of the first comparator 135a changes from Boolean value '1' to Boolean value '0'. When the short circuit occurs the resistance of the MEMS mirror 22 decreases, the voltage value across the MEMS micro mirror 22 (Um) decreases. So the voltage value at point C will increase, and exceed the value of the first reference voltage (Vrefp). The value of the first reference voltage (Vrefp) is determined by the maximum voltage value in point C in normal operation. In the case an open circuit in the MEMS micro-mirror device 130 the voltage at point C will drop to less than the second reference voltage (Vrefn) and the output E of the second comparator 135b changes from Boolean value '1' to Boolean value '0'. In case of open circuit, no current can drive through the MEMS micro-mirror 22. The voltage value of point C will drop to 0, and drop less than the reference voltage (Vrefp). Thus the occurrence of a short circuit in the MEMS micro-mirror device 130 can be detected by monitoring for a change in the output D of the first comparator 135a changes from Boolean value '1' to Boolean value '0', and the occurrence of an open circuit in the MEMS micro-mirror device 130 can be detected by monitoring for a change in the output E of the second comparator 135b changes from Boolean value '1' to Boolean value '0'.

The MEMS micro-mirror device 130 may further comprise a control unit which is operatively connected to the outputs D,E of the first and second comparators 135a,b respectively. The control unit is preferably configured to automatically shut-down the MEMS micro-mirror device 130 when either of the outputs D,E of the first and second comparators 135a,b change e.g. from a Boolean value '0' to a Boolean value '1' or from a Boolean value '1' to a Boolean value '0'.

Advantageously, in the present invention none of the variables used to detect an open or short circuit are unaffected by temperature, thus providing for more reliable detection of an open or short circuit. Furthermore, the time required to detect an open or short circuit depends only on the gain of the comparator, so fast detection is achievable.

It will be understood that in the context of the present invention "normal operation" is when the MEMS micro-mirror device operates without any short or open circuits. It will also be understood that in the above examples the detection of an open or short circuit was based on a change in an output of the device from a Boolean value '0' to a Boolean value '1'; it will be understood that the circuits of the above-mentioned device could alternatively be configured to have an output which changes from a Boolean value '1' to a Boolean value '0' when an open or short circuit occurs, for example by reversing the inputs to comparators i.e. by changing the input to the positive input of the comparator to be the input to the negative input of the comparator and by changing the input to the negative input of the comparator to be the input to the positive input of the comparator. What is important is a state change; any state change is acceptable i.e. the comparator may be designed to either go from '0' to '1' or from '1' to '0' to indicate the presence of the open or short circuit.

In the above example the voltage offsets (Uoff) are positive voltage offsets. However it will be understood that the voltage offsets (Uoff) may alternatively be a negative voltage offset. In the case of a negative voltage offset, the inputs to comparators should be reversed and the negative voltage offset is provided to the input to the negative input of the comparator.

It will also be understood that the comparators may be alternatively be configured to compare currents instead of voltages.

As an alternative to the comparators used in the above-mentioned examples an ADC may be used to perform the comparisons. In other words the means for comparing in each device may comprise a analogue to digital converter.

The invention claimed is:

1. An apparatus comprising:
a microelectromechanical system (MEMS) mirror comprising:
a mirror; and
a conduction coil to conduct a current and apply a force to the mirror to oscillate the mirror about at least one axis;
a power supply circuit electrically coupled to the MEMS mirror, the power supply circuit to selectively apply voltage to a first side of the conduction coil or a second side of the conduction coil;
a current source electrically coupled to the power supply circuit; and
a comparator to compare a voltage at the first and second side of the conduction coil to a voltage across the current source to detect an open circuit in the MEMS mirror.

2. The apparatus of claim 1, the power supply circuit comprising an H bridge circuit.

3. The apparatus of claim 2, the comparator comprising:
an OR gate having at least a first and a second input;
a first comparator coupled to the first input of the OR gate; and
a second comparator coupled to the second input of the OR gate.

4. The apparatus of claim 3, wherein the voltage at the first side of the conduction coil and the voltage across the current source are inputs to the first comparator and the voltage at the second side of the conduction coil and the voltage across the current source are inputs to the second comparator.

5. The apparatus of claim 3, the current source comprising a first and a second transistor electrically connected in series, wherein the voltage at the first side of the conduction coil and the voltage at a junction between the first and second transistors are inputs to the first comparator and the voltage at the second side of the conduction coil and the voltage at the junction between the first and second transistors are inputs to the second comparator.

6. The apparatus of claim 2, the current source comprising a first and a second transistor electrically connected in series, the comparator to compare a voltage at the first and second side of the conduction coil to a voltage at a junction between the first and second transistors.

7. The apparatus of claim 6, wherein the voltage across the first and second transistors and the voltage at a junction between the first and second transistors are inputs to the comparator.

8. The apparatus of claim 2, the comparator comprising:
an XNOR gate having at least a first and a second input;
a first comparator coupled to the first input of the XNOR gate; and
a second comparator coupled to the second input of the XNOR gate, wherein the voltage at the first side of the conduction coil and the voltage at the second side of the conduction coil are inputs to the first comparator and the voltage at the first side of the conduction coil and the voltage at the second side of the conduction are inputs to the second comparator.

9. The apparatus of claim 2, the comparator to compare the voltage across the current source to a reference voltage to detect an open circuit in the MEMS mirror.

10. The apparatus of claim 2, the comparator comprising:
a buffer electrically connected to a junction between the H bridge and the current source; and
a low pass filter which is electrically connected to the junction between the H bridge and current source, wherein the comparator to compare an output of the buffer to an output of the low pass filter.

11. A method comprising:
determining a first voltage at a first side of a conduction coil of a microelectromechanical system (MEMS) mirror, the conduction coil to conduct a current and apply a force to a mirror element of the MEMS mirror to oscillate the mirror element about at least one axis;
determining a second voltage at a second side of the conduction coil;
comparing the first voltage and the second voltage; and
detecting a change in the comparison to detect an open circuit in the MEMS mirror.

12. The method of claim 11, the conduction coil to be driven by a current source comprising a first and a second transistor operably coupled in series, the method comprising:
comparing a voltage across the first and second transistors to a voltage at a junction between the first and second transistors; and
detecting a change in comparison of the voltage across the first and second transistors to the voltage at a junction between the first and second transistors to detect an open circuit in the MEMS mirror.

13. The method of claim 11, the conduction coil to be driven by a current source, the method comprising:
comparing a voltage across the current source to a reference voltage; and
detecting a change in comparison of the voltage across the current source to the reference voltage to detect an open circuit in the MEMS mirror.

14. The method of claim 13, wherein the reference voltage is an average value of the voltage across the current source over a predefined period of time.

15. A system comprising:
a light source to emit a light beam;
a microelectromechanical system (MEMS) mirror, the MEMS mirror comprising:
a mirror to receive the light beam and reflect the light beam; and
a conduction coil to conduct a current and apply a force to the mirror to oscillate the mirror about at least one axis;
a power supply circuit electrically coupled to the MEMS mirror, the power supply circuit to selectively apply voltage to a first side of the conduction coil or a second side of the conduction coil;
a current source electrically coupled to the power supply circuit; and
a comparator to compare a voltage at the first and second side of the conduction coil to a voltage across the current source to detect an open circuit in the MEMS mirror.

16. The system of claim 15, comprising a controller to send a control signal to the light source to turn off the light based on a detection of an open circuit in the MEMS mirror.

17. The system of claim 15, the power supply circuit comprising an H bridge circuit.

18. The system of claim 17, the comparator comprising:
an OR gate having at least a first and a second input;
a first comparator coupled to the first input of the OR gate; and
a second comparator coupled to the second input of the OR gate.

19. The system of claim 17, the comparator comprising:
an XNOR gate having at least a first and a second input;
a first comparator coupled to the first input of the XNOR gate; and
a second comparator coupled to the second input of the XNOR gate, wherein the voltage at the first side of the conduction coil and the voltage at the second side of the conduction coil are inputs to the first comparator and the voltage at the first side of the conduction coil and the voltage at the second side of the conduction are inputs to the second comparator.

20. The system of claim 17, the comparator comprising:
a buffer electrically connected to a junction between the H bridge and the current source; and
a low pass filter which is electrically connected to the junction between the H bridge and current source, wherein the comparator to compare an output of the buffer to an output of the low pass filter.

* * * * *